May 20, 1969 W. ENGBERT 3,445,303

MANUFACTURE OF SEMICONDUCTOR ARRANGEMENTS USING A MASKING STEP

Filed Oct. 24, 1965

INVENTOR

Wilhelm Engbert

BY Spencer & Kaye

ATTORNEYS

United States Patent Office 3,445,303

Patented May 20, 1969

3,445,303

MANUFACTURE OF SEMICONDUCTOR ARRANGEMENTS USING A MASKING STEP

Wilhelm Engbert, Talheim, Germany, assignor to Telefunken Patentverwertungsgesellschaft m.b.H., Ulm (Danube), Germany Filed Oct. 24, 1965, Ser. No. 504,685

Claims priority, application Germany, Oct. 31, 1964, 27,337

Int. Cl. H01l 7/44

U.S. Cl. 148—187 12 Claims

ABSTRACT OF THE DISCLOSURE

A method for forming a semiconductor arrangement having a semiconductor body in which is diffused a semiconductor zone whose cross section is smaller than that of the body by removing portions of the semiconductor body to produce a protruding region having a cross section which is equal to that of the semiconductor zone to be diffused, covering all of the surfaces of the body which are produced by such removal with a diffusion mask so as to leave the upper surface of the protruding region free, diffusing the semiconductor zone into the region, starting from the unmasked surface thereof, and filling in the depressed regions formed by the removal step for providing a device having a flat upper surface which facilitates the mounting of conductive paths.

The present invention relates to a process for the manufacture of a semiconductor arrangement, and particularly an arrangement in which a semiconductor zone is diffused onto a semiconductor body whose cross section is larger than that of the zone.

In semiconductor arrangements having a planar structure, barrier layers are conventionally produced by diffusing impurities in the vicinity of a diffusion aperture, or window, of an oxide mask disposed on the semiconductor body. The plane of the pn-junction thus produced has, however, a curved configuration at the edges of the diffused layer due to the fact that this junction bends upwardly toward the surface of the semiconductor body. This curvature permits the development of high local field strengths which lower the breakdown voltage of the device. As a result, it is extremely difficult to utilize the planar technique for producing transistors having high blocking voltages and good frequency characteristics. This is also true for the production of diodes having high breakdown voltages.

It is a primary object of the present invention to eliminate these drawbacks.

It is a more specific object of the present invention to produce a device according to the planar technique having a rigorously flat pn-junction.

In accordance with the present invention, these results are achieved by the practice of a method for producing a semiconductor arrangement having a semiconductor body in which is diffused a semiconductor zone whose cross section is smaller than that of the body. This method is carried out by removing portions of the semiconductor body to produce a region having a cross section which is equal to that of the semiconductor zone to be diffused, by providing the lateral surface portions of this region with a diffusion mask, and by diffusing the semiconductor zone into the region, starting from the unmasked surface of the region.

In further accordance with the present invention, the diffusion mask is constituted by a thin layer of oxide material disposed at least on the lateral surface portions of the region.

According to another feature of this invention, the removed portions of the semiconductor body are filled in with insulating material or semiconductor material to give the resulting unit a flat upper surface which facilitates the mounting of conductive paths.

Additional objects and advantages of the present invention will become apparent upon consideration of the following description when taken in conjunction with the accompanying drawings in which.

Figure 1:
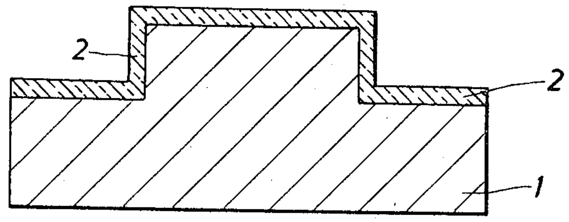
FIGURES 1 to 3 are cross-sectional views showing three stages of a process of the present invention.
Figure 2:
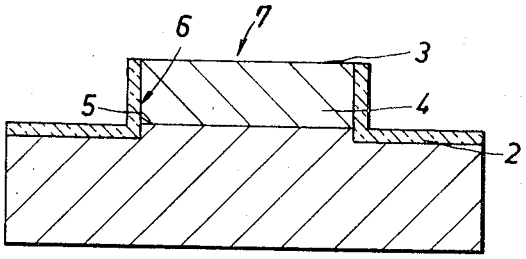
Figure 3:
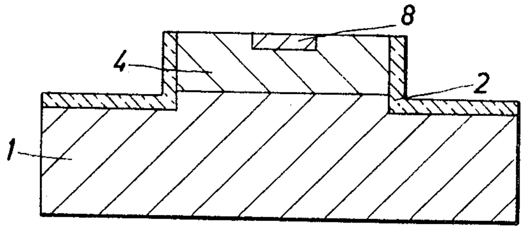

FIGURES 1 and 2 relate to the production of a semiconductor diode, while FIGURE 3 relates to the production of a transistor.

As is shown in FIGURE 1, a silicon semiconductor body 1 is first provided and has portions removed from one side thereof by etching or by any other suitable process to produce a raised portion in which a mesa semiconductor device will be produced. The term "mesa" is a generally accepted designation in the art to refer to transistors and diodes having a physical configuration which resembles the geological formations bearing that name. The side of the body 1 from which these portions are removed is then subjected to oxidation to produce the silicon dioxide layer 2. The layer 2 may also be formed by applying a coating of any suitable insulating material.

Referring now to FIGURE 2, a diffusion aperture 3 is then produced by etching away a portion of the layer 2, preferably by means of the photoresistance technique. However, the oxide layer can also be removed by a suitable machining or grinding operation. A diffusion process is then carried out in the projecting portion of body 1, starting from the surface exposed by the aperture 3. This diffusion process creates a diffusion zone 4 of opposite conductivity type from that of the original semiconductor body 1. Thus, in a p-type semiconductor body, for example, an n-type diffusion zone is created. The pn-junction 5 produced by this diffusion process is perfectly planar and does not have any curvature at its borders inasmuch as this junction extends all the way to the lateral edges 6 of the mesa-like portion 7.

It is then only necessary to provide suitable electrodes for the two regions of the resulting semiconductor unit in order to produce a finished diode which is ready for insertion into a circuit.

A transistor may be produced according to the present invention by following the same procedure as that described in connection with FIGURES 1 and 2. In this case, the starting semiconductor body 1 will be chosen to have the conductivity type of the collector zone and the diffusion zone 4 will be given the opposite type of conductivity so that it may serve as the base zone. Then, an emitter zone 8, as is shown in FIGURE 3, having the same conductivity type as the collector zone will be provided in the base zone 4 by alloying or diffusion. Again, it is then only necessary to provide suitable electrodes for each transistor zone in order to place the resulting device in condition for utilization in a circuit.

Figure 4:
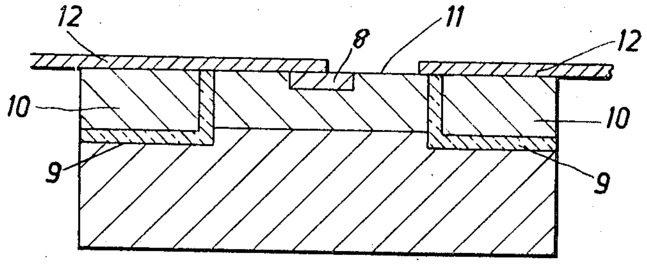
FIGURE 4 is a similar view showing a device produced according to a variation of the process of the present invention.

Turning now to FIGURE 4, there is shown a modification of the device of FIGURE 3 according to another feature of the present invention. The device of FIGURE 4 is produced, starting from the device of FIGURE 3, by applying masses 10 of insulating material, such as quartz, glass, or of semiconductor material upon the depressed surfaces 9 produced by the previously-described material removal process. The masses 10 are applied in such a way that their upper suafaces are coplanar with the upper surface 11 of the transistor. This procedure has the advantage of giving the top of the resulting mesa semiconductor device a planar support surface for the subsequently applied conductive paths 12 which are positioned so as to contact the semiconductor electrodes. As a result, the bends present in the conductive paths of the prior art planar transistors are avoided.

It may thus be seen that the present invention, in addition to providing a diffused semiconductor device having a perfectly planar pn-junction, provides for the filling of the depressions created by the creation of a mesa configuration in such a manner that the resulting device once again has the planar surface which was present prior to the removal of material from the semiconductor body. Such a construction has the advantage that, when using conductive paths for contacting the semiconductor electrodes, a planar support surface for these paths is produced. As a result, the bends which are normally present in the prior art conductive paths produced by the usual strip landing technique are avoided. This represents a substantial improvement because the sharp edges of the prior art bent conductive paths have a decided adverse influence on the conducting properties of these paths.

The insulating material used to fill in the depressions formed in the semiconductor body can be relatively thick so that the conductive paths formed thereon create low capacitances. These paths can also be formed so as to constitute resistors when used in a miniaturized circuit.

The filling in of the depressions in the semiconductor body can be carried out either before or after the diffusion step and can be carried out with insulating material or semiconductor material.

The devices produced according to the present invention thus represent a substantial improvement over prior art mesa diodes in which a portion of the semiconductor body is also removed and the semiconductor surface is provided with an oxide layer because the oxide layer in such prior art devices can be produced on the surface of the semiconductor body only after all of the required semiconductor zones have been diffused into the semiconductor body, while in the present case the oxide layer is provided prior to the diffusion process in order to permit the production of a rigorously planar pn-junction.

It will be understood that the above description of the present invention is susceptible to various modifications, changes and adaptations and the same are intended to be comprehended within the meaning and range of equivalents of the appended claims.

What is claimed is:

1. A method for producing a semiconductor arrangement having a semiconductor body in which is diffused a semiconductor zone whose cross section is smaller than that of the body, comprising the steps of:

(a) removing portions of the semiconductor body to produce a protruding region surrounded by depressed regions and having a cross section which is equal to that of the semiconductor zone to be diffused;
(b) providing a diffusion mask by forming a thin oxide layer on all of the surfaces of said body which are produced by said step of removing portions thereof;
(c) diffusing the semiconductor zone into said region, starting from the unmasked surface thereof; and
(d) filling in the depressed regions formed by said step of removing portions of the semiconductor body, said filling being carried out after said step of providing a mask and before said step of diffusing.

2. A method for producing a semiconductor arrangement having a semiconductor body in which is diffused a semiconductor zone whose cross section is smaller than that of the body, comprising the steps of:

(a) removing portions of the semiconductor body to produce a protruding region surrounded by depressed regions and having a cross section which is equal to that of the semiconductor zone to be diffused;
(b) providing a diffusion mask by forming a thin oxide layer on all of the surfaces of said body which are produced by said step of removing portions thereof;
(c) diffusing the semiconductor zone into said region, starting from the unmasked surface thereof; and
(d) filling in the depressed regions formed by said step of removing portions of the semiconductor body, said filling being carried out after said step of providing a mask and after said step of diffusing.

3. A method as defined in claim 1 wherein said diffusion mask is made of silicon dioxide.

4. A method as defined in claim 1 wherein insulating material is used for said filling in of the depressions.

5. A method as defined in claim 1 wherein semiconductor material is used for said filling in of the depressions.

6. A method as defined in claim 1 wherein said step of providing a diffusion mask is carried out by: forming an oxide layer on the entire surface of the side of said semiconductor body from which portions have been removed; and by removing a portion of the oxide layer from the surface of said protruding region from which said semiconductor zone is to be diffused.

7. A method as defined in claim 6 wherein said operation of removing a portion of the oxide layer is carried out by machining.

8. A method as defined in claim 6 wherein said operation of removing a portion of the oxide layer is carried out by etching utilizing the photoresistance technique.

9. A method as defined in claim 1 wherein said semiconductor zone is of the opposite conductivity type from said semiconductor body.

10. A method for producing a transistor as defined in claim 1, comprising the preliminary step of providing a semiconductor body having the conductivity type of the collector zone of the transistor, and wherein said step of diffusing is carried out to form a transistor base zone, said method further comprising the added step of forming an emitter zone in the diffused base zone.

11. A method as defined in claim 10 wherein said emitter zone is formed by alloying into the base zone.

12. A method as defined in claim 10 wherein said emitter zone is produced by diffusion.

References Cited

UNITED STATES PATENTS

| | | | |
|---|---|---|---|
| 2,964,689 | 12/1960 | Buschert | 148—186 XR |
| 3,040,218 | 6/1962 | Byczkowski | 148—186 XR |
| 3,194,699 | 7/1965 | White | 148—187 XR |
| 3,294,600 | 12/1966 | Yokota | 148—177 |

HYLAND BIZOT, *Primary Examiner.*